(12) United States Patent
Makinen et al.

(10) Patent No.: US 10,869,155 B2
(45) Date of Patent: Dec. 15, 2020

(54) GAIN CONTROL IN SPATIAL AUDIO SYSTEMS

(71) Applicant: Nokia Technologies Oy, Espoo (FI)

(72) Inventors: Jorma Makinen, Tampere (FI); Mikko Tammi, Tampere (FI); Mikko-Ville Laitinen, Helsinki (FI); Jussi Virolainen, Espoo (FI)

(73) Assignee: Nokia Technologies Oy, Espoo (FI)

( * ) Notice: Subject to any disclaimer, the term of this patent is extended or adjusted under 35 U.S.C. 154(b) by 0 days.

(21) Appl. No.: 16/335,381

(22) PCT Filed: Sep. 14, 2017

(86) PCT No.: PCT/FI2017/050655
§ 371 (c)(1),
(2) Date: Mar. 21, 2019

(87) PCT Pub. No.: WO2018/060549
PCT Pub. Date: Apr. 5, 2018

(65) Prior Publication Data
US 2019/0289420 A1 Sep. 19, 2019

(30) Foreign Application Priority Data
Sep. 28, 2016 (GB) ..................................... 1616479

(51) Int. Cl.
*H04S 7/00* (2006.01)
*H03G 3/24* (2006.01)
*H04R 1/28* (2006.01)

(52) U.S. Cl.
CPC ............... *H04S 7/304* (2013.01); *H03G 3/24* (2013.01); *H04R 1/2811* (2013.01); *H04S 2400/11* (2013.01); *H04S 2400/13* (2013.01); *H04S 2420/01* (2013.01)

(58) Field of Classification Search
CPC .. H04S 7/304; H04S 2400/11; H04S 2400/13; H04S 2420/01; H03G 3/24; H04R 1/2811
See application file for complete search history.

(56) References Cited

U.S. PATENT DOCUMENTS

| 7,391,877 B1 | 6/2008 | Brungart ....................... 381/310 |
| 2005/0080616 A1* | 4/2005 | Leung ................... H04R 5/027 704/200.1 |
| 2016/0021476 A1 | 1/2016 | Robinson et al. |

(Continued)

FOREIGN PATENT DOCUMENTS

| JP | 2015233252 A | 12/2015 |
| WO | WO 2016/145261 A1 | 9/2016 |
| WO | WO-2017/182714 A1 | 10/2017 |

*Primary Examiner* — Andrew L Sniezek
(74) *Attorney, Agent, or Firm* — Harrington & Smith

(57) ABSTRACT

Apparatus including a processor configured to: provide a position for at least one sound source relative to a reference position; analyse at least one input audio signal associated with the at least one sound source to determine at least one gain value based on the at least one input audio signal and the position for the at least one sound source relative to the reference position; and synthesize at least two output channels based on the at least one input audio signal, a directional transfer function pair, the at least one gain value and the position for the at least one sound source relative to the reference position.

20 Claims, 10 Drawing Sheets

(56) References Cited

U.S. PATENT DOCUMENTS

| | | |
|---|---|---|
| 2016/0112819 A1 | 4/2016 | Mehnert et al. |
| 2016/0134987 A1* | 5/2016 | Gorzel .................... H04S 7/304 |
| | | 381/310 |
| 2016/0266865 A1 | 9/2016 | Tsingos et al. |
| 2017/0180907 A1* | 6/2017 | Kuhr ....................... H04S 3/004 |
| 2018/0270571 A1* | 9/2018 | Di Censo .................. G06F 3/16 |
| 2018/0295459 A1* | 10/2018 | Cartwright ................ H04S 7/30 |
| 2019/0215638 A1* | 7/2019 | Stein ..................... G10L 19/008 |

* cited by examiner

GAIN CONTROL IN SPATIAL AUDIO SYSTEMS

CROSS REFERENCE TO RELATED APPLICATION

This patent application is a U.S. National Stage application of International Patent Application Number PCT/FI2017/050655 filed Sep. 14, 2017, which is hereby incorporated by reference in its entirety, and claims priority to GB 1616479.0 filed Sep. 28, 2016.

FIELD

The present application relates to apparatus and methods for providing gain control in audio systems using head-tracking inputs. The invention further relates to, but is not limited to, apparatus and methods for providing gain control in spatial audio systems using head-tracking inputs to enable spatial reproduction of audio signals.

BACKGROUND

The capture and presentation of audio signals from multiple sources in a spatial field requires significant processing effort. For example the capture and mixing of an audio signal source such as a speaker or artist within an audio environment such as a theatre or lecture hall to be presented to a listener and produce an effective audio atmosphere requires significant processing.

A commonly implemented system would be to utilize a close or external microphones, for example a Lavalier microphone worn by the user or a microphone attached to a boom pole to capture audio signals close to the speaker or other sources external to a spatial audio signal. These signals can then be mixed with a spatial (or environmental or audio field) audio signal captured from a microphone array and rendered to a user based on a determined directional input from the user.

The level and dynamics of the captured audio content varies greatly depending on recording situation. Typically, a rendered or mixed audio signal headroom, which refers to the amount by which the audio signal may temporarily exceed a 'maximum level' without damaging the playback system or the audio signal by clipping, must be minimized to enable easy listening of distant or silent sound sources. This is especially important for portable players because of the noisy listening environment and sound pressure limitations in headphones and speaker outputs.

A user listening on a head-tracking system and listening via headphones typically has mixed audio signal or soundscape rendered into a binaural format which moves based on how their head moves. The position (though typically only orientation is considered) of the user listening therefore has an influence on the level of the rendered (binaural) audio signals. For example whether an ear is directly pointing to a sound source and hence the high frequencies are amplified or pointing away from a sound source and hence the high frequencies are diminished can change the output level. To allow for this orientation or positional variability in the audio signal and thus avoid clipping, additional headroom is needed for the audio content, which is not desired.

Furthermore conventional automatic gain control (AGC) and dynamic range compression (DRC) algorithms used to balance the 'loudness' of the audio signal require applying a delay to the audio signal before processing and outputting it. This is not acceptable for the rendering of soundscapes using the head-tracking inputs. The motion of the soundscape should ideally follow the move of head without any perceivable time lag, otherwise the perceived spatial-audio quality severely deteriorates. Hence, level control functions causing detectable delay cannot be applied for the rendered audio signals.

Thus, there is a need to develop solutions in which the gain control may be applied taking into account of both the complexity of the input and without introducing any additional delay to the audio system.

SUMMARY

The application relates to gain-control in a spatial-audio-reproduction system where the position for the listener may have an effect on the level of the synthetized audio. The gain control is being provided such that the synthetized audio can react to a changed position with no additional delay allocated for the gain control function. This has been achieved by estimating the level of the rendered binaural output signals using information about (estimated or known) positions of sound sources and listener as well as characteristics of input, and by using the spatial-audio-reproduction system to apply the gain.

There is provided according to a first aspect an apparatus comprising a processor configured to: provide a position for at least one sound source relative to a reference position; analyse at least one input audio signal associated with the at least one sound source to determine at least one gain value based on the at least one input audio signal and the position for the at least one sound source relative to the reference position; and synthesize at least two output channels based on the at least one input audio signal, a directional transfer function pair, the at least one gain value and the position for the at least one sound source relative to the reference position.

The processor configured to provide the position for at least one sound source relative to the reference position may be configured to analyse at least two microphone audio signals to determine the position for the sound source relative to the reference position.

The processor configured to provide the position for at least one sound source relative to the reference position may be configured to retrieve the position for the sound source relative to the reference position from metadata associated with the at least one input audio signal.

The metadata associated with the at least one input signal may comprise a directional parameter of the metadata for a frequency band.

The processor configured to analyse the at least one input audio signal associated with the at least one sound source may be configured to: determine at least one input audio signal level, wherein the at least one gain value may be determined based on the at least one input audio signal level and the position for the at least one sound source relative to the reference position.

The processor may be further configured to determine a position and/or orientation of a tracker relative to the reference position.

The processor may be further configured to determine a level control gain based on the difference between the position and/or orientation of the at least one sound source and the tracker.

The processor configured to determine the level control gain based on the difference between the position and/or orientation of the at least one sound source and the tracker may be configured to: determine at least one level control gain function based on the at least one input audio signal level; and determine the level control gain based on the difference between the position and/or orientation of the at least one sound source and the tracker applied to the at least one level control gain function.

The processor may be configured to synthesize the at least two output channels based on the input audio signal, the directional transfer function pair, the at least one level control gain value and the difference between the position and/or orientation of the at least one sound source and the tracker.

The processor configured to determine the position and/or orientation of the tracker may be configured to receive at least one of: a direction from a digital compass; a direction from a gyroscope; a direction from a beacon positioning system; and a modelled direction with inertia and mass such that the position is an estimate of a future actual tracker position.

The processor configured to determine the level control gain based on the difference between the position and/or orientation for the at least one sound source and the tracker may be configured to determine: a first frequency band related level control gain for a first frequency band associated with the input audio signal based on the difference between the position and/or orientation of the at least one sound source and the tracker; and a second frequency band level control gain for a second frequency band associated with the input audio signal based on the difference between the position and/or orientation of the at least one sound source and the tracker.

The processor configured to determine the level control gain based on the difference between the position and/or orientation of the at least one sound source and the tracker may be configured to determine: a first output channel related level control gain for a first output channel based on the difference between the position and/or orientation of the at least one sound source and the tracker; and a second output channel related level control gain for a second output channel based on the difference between the position and/or orientation of the at least one sound source and the tracker.

The processor configured to synthesize the at least two output channels based on the input audio signal, the directional transfer function pair, the at least one level control gain value and the difference between the position and/or orientation of the at least one sound source and the tracker may be configured to: generate a left output channel audio signal of the at least two output channels by multiplying a left level control gain value to a combination of a first head related transfer function based on the difference between the position and/or orientation of the at least one sound source and the tracker to the input audio signal and a modelled left ear position; and generate a right output channel audio signal of the at least two output channels by multiplying a right level control gain value to a combination of a second head related transfer function based on the difference between the position and/or orientation of the at least one sound source and the tracker to the input audio signal and a modelled right ear position.

The tracker may comprise a headband configured to generate the direction associated with the tracker, the direction being associated with a listening direction of the user.

The processor may be further configured to limit the output signal value of the at least two output channels such that the output signal value range falls within a defined pulse code modulation scheme dynamic range.

The at least two output channels may have a minimised overhead.

The reference position may be at least one of: an origin position and/or orientation for at least one spatially captured sound source; an origin position and/or orientation for a camera; and an origin position and/or orientation for a sound scene within which the at least one sound source is located.

According to a second aspect there is provided a method comprising: providing a position for at least one sound source relative to a reference position; analysing at least one input audio signal associated with the at least one sound source to determine at least one gain value based on the at least one input audio signal and the position for the at least one sound source relative to the reference position; and synthesizing at least two output channels based on the at least one input audio signal, a directional transfer function pair, the at least one gain value and the position for the at least one sound source relative to the reference position.

Providing the position for at least one sound source relative to the reference position may comprise analysing at least two microphone audio signals to determine the position for the sound source relative to the reference position.

Providing the position for at least one sound source relative to the reference position may comprise retrieving the position for the sound source relative to the reference position from metadata associated with the at least one input audio signal.

The metadata associated with the at least one input signal may comprise a directional parameter of the metadata for a frequency band.

Analysing the at least one input audio signal associated with the at least one sound source may comprise: determining at least one input audio signal level, wherein determining the at least one gain value may comprise determining the at least one gain value based on the at least one input audio signal level and the position for the at least one sound source relative to the reference position.

The method may comprise determining a position and/or orientation of a tracker relative to the reference position.

The method may further comprise determining a level control gain based on the difference between the position and/or orientation of the at least one sound source and the tracker.

Determining the level control gain based on the difference between the position and/or orientation of the at least one sound source and the tracker may comprise: determining at least one level control gain function based on the at least one input audio signal level; and determining the level control gain based on the difference between the position and/or orientation of the at least one sound source and the tracker applied to the at least one level control gain function.

The method may further comprise synthesizing the at least two output channels based on the input audio signal, the directional transfer function pair, the at least one level control gain value and the difference between the position and/or orientation of the at least one sound source and the tracker.

Determining the position and/or orientation of the tracker may comprise receiving at least one of: a direction from a digital compass; a direction from a gyroscope; a direction from a beacon positioning system; and a modelled direction with inertia and mass such that the position is an estimate of a future actual tracker position.

Determining the level control gain based on the difference between the position and/or orientation for the at least one sound source and the tracker may comprise: determining a first frequency band related level control gain for a first frequency band associated with the input audio signal based on the difference between the position and/or orientation of the at least one sound source and the tracker; and determining a second frequency band level control gain for a second frequency band associated with the input audio signal based on the difference between the position and/or orientation of the at least one sound source and the tracker.

Determining the level control gain based on the difference between the position and/or orientation of the at least one sound source and the tracker may comprise: determining a first output channel related level control gain for a first output channel based on the difference between the position and/or orientation of the at least one sound source and the tracker; and determining a second output channel related level control gain for a second output channel based on the difference between the position and/or orientation of the at least one sound source and the tracker.

Synthesizing the at least two output channels based on the input audio signal, the directional transfer function pair, the at least one level control gain value and the difference between the position and/or orientation of the at least one sound source and the tracker may comprise: generating a left output channel audio signal of the at least two output channels by multiplying a left level control gain value to a combination of a first head related transfer function based on the difference between the position and/or orientation of the at least one sound source and the tracker to the input audio signal and a modelled left ear position; and generating a right output channel audio signal of the at least two output channels by multiplying a right level control gain value to a combination of a second head related transfer function based on the difference between the position and/or orientation of the at least one sound source and the tracker to the input audio signal and a modelled right ear position.

The tracker may comprise a headband configured to generate the direction associated with the tracker, the direction being associated with a listening direction of the user.

The method may further comprise limiting the output signal value of the at least two output channels such that the output signal value range falls within a defined pulse code modulation scheme dynamic range.

The at least two output channels may have a minimised overhead.

The reference position may be at least one of: an origin position and/or orientation for at least one spatially captured sound source; an origin position and/or orientation for a camera; and an origin position and/or orientation for a sound scene within which the at least one sound source is located.

According to a third aspect there is provided an apparatus comprising: means for providing a position for at least one sound source relative to a reference position; means for analysing at least one input audio signal associated with the at least one sound source to determine at least one gain value based on the at least one input audio signal and the position for the at least one sound source relative to the reference position; and means for synthesizing at least two output channels based on the at least one input audio signal, a directional transfer function pair, the at least one gain value and the position for the at least one sound source relative to the reference position.

The means for providing the position for at least one sound source relative to the reference position may comprise means for analysing at least two microphone audio signals to determine the position for the sound source relative to the reference position.

The means for providing the position for at least one sound source relative to the reference position may comprise means for retrieving the position for the sound source relative to the reference position from metadata associated with the at least one input audio signal.

The metadata associated with the at least one input signal may comprise a directional parameter of the metadata for a frequency band.

The means for analysing the at least one input audio signal associated with the at least one sound source may comprise: means for determining at least one input audio signal level, wherein the means for determining the at least one gain value may comprise means for determining the at least one gain value based on the at least one input audio signal level and the position for the at least one sound source relative to the reference position.

The apparatus may comprise means for determining a position and/or orientation of a tracker relative to the reference position.

The apparatus may further comprise means for determining a level control gain based on the difference between the position and/or orientation of the at least one sound source and the tracker.

The means for determining the level control gain based on the difference between the position and/or orientation of the at least one sound source and the tracker may comprise: means for determining at least one level control gain function based on the at least one input audio signal level; and means for determining the level control gain based on the difference between the position and/or orientation of the at least one sound source and the tracker applied to the at least one level control gain function.

The apparatus may further comprise means for synthesizing the at least two output channels based on the input audio signal, the directional transfer function pair, the at least one level control gain value and the difference between the position and/or orientation of the at least one sound source and the tracker.

The means for determining the position and/or orientation of the tracker may comprise means for receiving at least one of: a direction from a digital compass; a direction from a gyroscope; a direction from a beacon positioning system; and a modelled direction with inertia and mass such that the position is an estimate of a future actual tracker position.

The means for determining the level control gain based on the difference between the position and/or orientation for the at least one sound source and the tracker may comprise: means for determining a first frequency band related level control gain for a first frequency band associated with the input audio signal based on the difference between the position and/or orientation of the at least one sound source and the tracker; and means for determining a second frequency band level control gain for a second frequency band associated with the input audio signal based on the difference between the position and/or orientation of the at least one sound source and the tracker.

The means for determining the level control gain based on the difference between the position and/or orientation of the at least one sound source and the tracker may comprise: means for determining a first output channel related level control gain for a first output channel based on the difference between the position and/or orientation of the at least one sound source and the tracker; and means for determining a second output channel related level control gain for a second output channel based on the difference between the position and/or orientation of the at least one sound source and the tracker.

The means for synthesizing the at least two output channels based on the input audio signal, the directional transfer function pair, the at least one level control gain value and the difference between the position and/or orientation of the at least one sound source and the tracker may comprise: means for generating a left output channel audio signal of the at least two output channels by multiplying a left level control gain value to a combination of a first head related transfer function based on the difference between the position and/or orientation of the at least one sound source and the tracker to the input audio signal and a modelled left ear position; and means for generating a right output channel audio signal of the at least two output channels by multiplying a right level control gain value to a combination of a second head related transfer function based on the difference between the position and/or orientation of the at least one sound source and the tracker to the input audio signal and a modelled right ear position.

The tracker may comprise a headband configured to generate the direction associated with the tracker, the direction being associated with a listening direction of the user.

The apparatus may further comprise means for limiting the output signal value of the at least two output channels such that the output signal value range falls within a defined pulse code modulation scheme dynamic range.

The at least two output channels may have a minimised overhead.

The reference position may be at least one of: an origin position and/or orientation for at least one spatially captured sound source; an origin position and/or orientation for a camera; and an origin position and/or orientation for a sound scene within which the at least one sound source is located.

A computer program product stored on a medium may cause an apparatus to perform the method as described herein.

An electronic device may comprise apparatus as described herein.

A chipset may comprise apparatus as described herein.

Embodiments of the present application aim to address problems associated with the state of the art.

SUMMARY OF THE FIGURES

For a better understanding of the present application, reference will now be made by way of example to the accompanying drawings in which.

EMBODIMENTS OF THE APPLICATION

Figure 1A:
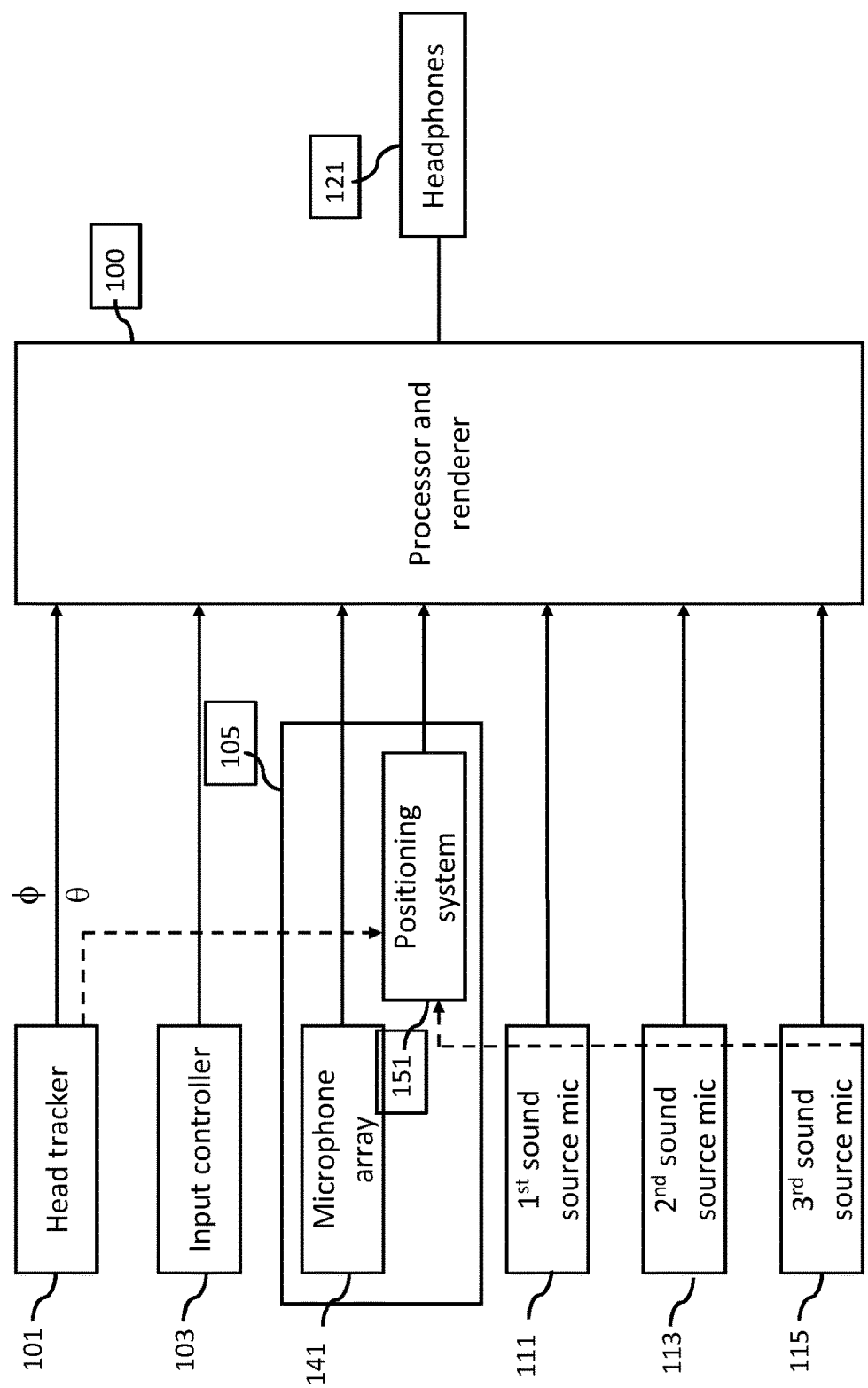
FIGS. 1a and 1b show schematically a distributed audio capture and processing system and apparatus suitable for implementing some embodiments.

The following describes in further detail suitable apparatus and possible mechanisms for the provision of effective gain control of audio signals in spatially processed audio signals and particularly with respect to audio signals rendered based on inputs from a tracker. The tracker may for example be a head-tracker monitoring a listener's head orientation. In the following examples, audio signals and audio capture signals are described. However it would be appreciated that in some embodiments the apparatus may be part of any suitable electronic device or apparatus configured to capture an audio signal or receive the audio signals and other information signals.

As described previously a conventional approach to gain control is one where loudness control may be implemented by delay line, a gain (or dynamic range) controller and a multiplier. A gain or dynamic range controller may determine an amplitude of an input signal, compute a gain to be applied to the signal while the input signal is passed through delay line and then apply the gain using the multiplier to adjust the amplitude of the output signal. When the amplitude of the input signal exceeds a predetermined threshold, the gain controller limits the amplitude of the output signal to be below a determined threshold. This may be improved with the implementation of a multiband gain or dynamic range controller system that may increase an overall loudness of an output signal by controlling thresholds and gains using a plurality of controllers, each of which control the gain for a defined frequency range. Frequency dependent control may allow the increase of the loudness of an output signal when input power is concentrated in one frequency band however it typically requires a filtering or frequency division stage which increases the processing delay and the computation load of the system.

The concept as discussed in detail hereafter may for example be embodied as part of a spatial-audio-reproduction system. This system may be part of a capture system configured to capture both external (speaker, instrument or other source) audio signals and a spatial (audio field) audio signal. In the embodiments described herein, the gain-control system is thus integrated into a spatial-audio-reproduction system in order to minimize the need for headroom, and to minimize the computational complexity and the time delay.

The embodiments described herein thus may implement binaural spatial-audio-reproduction methods where the method estimates the direction of arrival (DOA) of any audio sources and the ratio of direct (such as audio source) and ambient (or background) components, and synthesize binaural output signals using this information and the orientation of the listener's head-tracker input.

The integrated gain control method and apparatus therefore uses information about (estimated or known) positions of sound sources and the user listening (for example from the head-tracker) to the output signals to estimate the level of the rendered binaural output signals. In such a manner the method and apparatus may integrate the gain control functions into the spatial-audio processing and rendering system.

This may bring two major benefits. Firstly, the rendering functions of the spatial-audio-reproduction system may be used and smooth gain changes and frequency-dependent gains may be applied without increasing delay or processing load. Secondly, it is possible to 'reach' an optimal headroom configuration.

A suitable method and apparatus for a gain control implemented as part of a distributed audio capture system is described hereafter. The examples hereafter are described with respect to capture and processing of live content. However further examples may be employed which are suitable for processing live and recorded content (or only recorded content).

The method as described in further detail hereafter consists of using outputs from a head tracking apparatus to modify gain/processing parameters associated with the output audio signals. Although the capture, mixer and output systems in the following examples are shown as being separate, they may be implemented with the same apparatus or may be distributed over a series of physically separate but communication capable apparatus.

Furthermore it is understood that at least some elements of the following apparatus may be implemented within a distributed computing system such as known as the 'cloud'.

With respect to FIG. 1a is shown an example distributed audio capture and processing system suitable for implementing gain control according to some embodiments.

In the following examples there is shown three external sound sources, however more than three or fewer than three sound sources may be captured and the following apparatus and methods applied. For example the system 99 comprises a first sound source microphone 111. The first sound source microphone 111 may be a Lavalier microphone or other example of a 'close' sound source capture apparatus. For example in some embodiments the first sound source microphone may be a boom microphone or similar neighbouring microphone capture system. The first sound source microphone 111 may in some embodiments be a microphone array. The first sound source microphone 111 as shown in FIG. 1a may be a microphone associated with a first audio source such as a vocalist.

The system 99 may also comprise a second sound source microphone 113. The second sound source microphone 113 may be a microphone or microphone array associated with a second audio source such as an instrument. For example the second sound source microphone is an internal microphone system (pick-up microphone) in an electric guitar.

The system 99 may also comprise a third sound source microphone 115. The third sound source microphone 115 may be a microphone or microphone array associated with a third audio source. For example the third sound source microphone is a microphone associated with a drum.

It is understood that the sound source microphones 111, 113, 115 may both move dynamically with their associated sound source and also reflect the dynamic audio output of the source.

The sound source microphones 111, 113, 115 may be configured to output their captured audio signals to a processor and renderer 100. For example a first sound source microphone 111 may comprise a transmitter unit (not shown), which wirelessly transmits the audio signal to a receiver unit (not shown) on the processor and renderer 100.

The system 99 may further comprise a spatial audio capture (SPAC) device 105. The spatial audio capture device 105 is an example of an 'audio field' capture apparatus and may in some embodiments be a directional or omnidirectional microphone array configured to capture an audio signal associated with an ambient sound scene represented by the sound sources described herein and other ambient sound sources. The spatial audio capture device 105 may be configured to output the captured audio signals to the processor and renderer 100.

In some embodiments the spatial audio capture device 105 is implemented within a mobile device. The spatial audio capture device is thus configured to capture spatial audio, which, when rendered to a listener, enables the listener to experience the sound field as if they were present in the location of the spatial audio capture device.

The spatial audio capture device 105 furthermore may comprise a position determiner or position tracker (not shown in FIG. 1a). The position tracker or determiner may be configured to generate a suitable output identifying the position for the sound source microphones 111, 113, 115 (and therefore their associated sound sources) relative to the spatial audio capture device 105 and output this information to the processor and renderer 100. The dashed lines shown in FIG. 1a from sound source microphones 111, 113, 115 may carry output from the position tracker or determiner to position system 151. In the following examples the spatial audio capture device is used as an example of a reference position, however any suitable object position may be used as the reference. The position determination/tracking may be achieved by any suitable means or method.

For example in some embodiments the positioning system may use satellite positioning signals (or other beacon signals) to estimate the positions of the sources and the spatial audio capture device (and in some embodiments the mixer). These estimated positions may be transmitted to a position determiner or position tracker configured to receive the positions and in some embodiments determine positions of the sources relative to the spatial capture devices (and/or mixer or mix controller).

The position determination may be performed by local radio-frequency signal estimation. Thus for example the sound source microphones may comprise position tags. The position tags may be configured to generate and transmit radio frequency signals which can be received be a suitable receiver which enables the receiver or position determiner determine information suitable for identifying the position or location of the sound source microphones relative to the receiver. The spatial audio capture device 105 thus may further comprise a position tag receiver configured to receive the radio frequency signals from the position tags associated with the sound sources. The spatial audio capture device 105 may further comprise a position determiner configured to determine an estimate of the position of the tag relative to the spatial audio capture device. As microphones worn by people/located on instruments can freely move in the acoustic space, the position determiner has to support continuous sensing of microphone position.

In some embodiments the receiver and/or position tracker or determiner may be separate from the spatial audio capture device 105. In such embodiments the spatial audio capture device itself comprises (or is associated with) a position tag generating a radio frequency signal which enables the receiver/position determiner to estimate the position of the spatial audio capture device relative to the position determiner. The position determiner may then determine the relative position(s) of the sound sources (or their associated position tags) and the spatial audio capture device (and its associated position tag).

In some embodiments the position tags and the position determiner are implemented using a High Accuracy Indoor Positioning (HAIP) system or another suitable indoor positioning technology. Thus the position tags are HAIP tags, and the position receiver and/or position tracker is a HAIP locator configured to track the positions of the tags.

In some embodiments, in addition to radio frequency based position estimation, the position determiner and/or position tracker may use video content analysis and/or sound source localization.

Thus in some embodiments the position or location of the spatial audio capture device is determined. The location of the spatial audio capture device may be denoted (at time 0) as $$(x_S(0), y_S(0))$$

In some embodiments there may be implemented a calibration phase or operation (in other words defining a 0 time instance) where a first sound source (s1) microphone is positioned in front of the SPAC array at some distance within the range of a HAIP locator. This position of the first sound source microphone may be denoted as $$(x_{S1}(0), y_{S1}(0))$$

Furthermore in some embodiments this calibration phase can determine the 'front-direction' of the spatial audio capture device in the HAIP coordinate system. This can be performed by firstly defining the array front direction by the vector $$(x_{S1}(0)-x_S(0), y_{S1}(0)-y_S(0))$$

This vector may enable the position tracker to determine an azimuth angle $\alpha_{S1}$ and the distance $d_{S1}$ with respect to the array.

For example given a first sound source microphone position at time t $$(x_{S1}(t), y_{S1}(t))$$

The direction relative to the array is defined by the vector $$(x_{S1}(t)-x_S(0), y_{S1}(t)-y_S(0))$$

The azimuth $\alpha$ may then be determined as $$\alpha = a\tan 2(y_{S1}(t)-y_S(0), x_{S1}(t)-x_S(0)) - a\tan 2(y_{S1}(0)-y_S(0), x_{S1}(0)-x_S(0))$$

where a tan 2(y,x) is a "Four-Quadrant Inverse Tangent" which gives the angle between the positive x-axis and the point (x,y). Thus, the first term gives the angle between the positive x-axis (origin at $x_S(0)$ and $y_S(0)$) and the point $(x_{S1}(t), y_{S1}(t))$ and the second term is the angle between the x-axis and the initial position $(x_{S1}(0), y_{S1}(0))$. The azimuth angle may be obtained by subtracting the first angle from the second.

The distance d can be obtained as $$\sqrt{(x_{S1}(t)-x_S(0))^2+(y_{S1}(t)-y_S(0))^2}$$

In some embodiments, since the HAIP location data may be noisy, the positions $(x_{S1}(0), y_{S1}(0)$ and $(x_S(0), y_S(0))$ may be obtained by recording the positions of the HAIP tags of the audio capture device and the first sound source over a time window of some seconds (for example 30 seconds) and then averaging the recorded positions to obtain the inputs used in the equations above.

In some embodiments the calibration phase may be initialized by the SPAC device (for example the mobile device) being configured to output a speech or other instruction to instruct the user(s) to stay in front of the array for the 30 second duration, and give a sound indication after the period has ended.

Although the examples shown above show the position determiner and/or position tracker generating position information in two dimensions it is understood that this may be generalized to three dimensions, where the position determiner and/or position tracker may determine an elevation angle as well as an azimuth angle and distance.

In some embodiments other position determination/tracking means can be used for locating and tracking the moving sources. Examples of other tracking means may include inertial sensors, radar, ultrasound sensing, Lidar or laser distance meters, visual analysis, audio analysis and so on.

Visual analysis, for example, may be performed in order to localize and track pre-defined sound sources, such as persons and musical instruments. The visual analysis may be applied on panoramic video which is captured along with the spatial audio. This analysis may thus identify and track the position of persons carrying the sound source microphones based on visual identification of the person. The advantage of visual tracking is that it may be used even when the sound source is silent and therefore when it is difficult to rely on audio based tracking. The visual tracking can be based on executing or running detectors trained on suitable datasets (such as datasets of images containing pedestrians) for each panoramic video frame. In some other embodiments tracking techniques such as kalman filtering and particle filtering can be implemented to obtain the correct trajectory of persons through video frames. The location of the person with respect to the front direction of the panoramic video, coinciding with the front direction of the spatial audio capture device, can then be used as the direction of arrival for that source. In some embodiments, visual markers or detectors based on the appearance of the sound source microphones could be used to help or improve the accuracy of the visual tracking methods.

In some embodiments visual analysis can not only provide information about the 2D position of the sound source (i.e., coordinates within the panoramic video frame), but can also provide information about the distance, which is proportional to the size of the detected sound source, assuming that a "standard" size for that sound source class is known. For example, the distance of 'any' person can be estimated based on an average height. Alternatively, a more precise distance estimate can be achieved by assuming that the system knows the size of the specific sound source. For example the system may know or be trained with the height of each person who needs to be tracked.

In some embodiments the 3D or distance information may be achieved by using depth-sensing devices. For example a 'Kinect' system, a time of flight camera, stereo cameras, or camera arrays, can be used to generate images which may be analysed and from image disparity from multiple images a depth may or 3D visual scene may be created. These images may be generated by a camera.

Audio source position determination and tracking can in some embodiments be used to track the sources. The source direction can be estimated, for example, using a time difference of arrival (TDOA) method. The source position determination may in some embodiments be implemented using steered beamformers along with particle filter-based tracking algorithms.

In some embodiments audio self-localization can be used to track the sources. There are technologies, in radio technologies and connectivity solutions, which can furthermore support high accuracy synchronization between devices which can simplify distance measurement by removing the time offset uncertainty in audio correlation analysis. These techniques have been proposed for future WiFi standardization for the multichannel audio playback systems.

In some embodiments, position estimates from indoor positioning, visual analysis, and audio source localization can be used together, for example, the estimates provided by each determiner or estimator may be averaged to obtain improved position determination and tracking accuracy. Furthermore, in order to minimize the computational load of visual analysis (which is typically much "heavier" than the analysis of audio or HAIP signals), visual analysis may be applied only on portions of the entire panoramic frame, which correspond to the spatial locations where the audio and/or HAIP analysis sub-systems have estimated the presence of sound sources.

Position estimation can, in some embodiments, combine information from multiple sources and combination of multiple estimates has the potential for providing the most accurate position information for the proposed systems. However, it is beneficial that the system can be configured to use a subset of position sensing technologies to produce position estimates even at lower resolution.

The system 99 furthermore may comprise a processor and renderer 100 configured to receive the outputs of the sound source microphones 111, 113, 115 and the spatial audio capture device 105. Furthermore in some embodiments the processor and renderer 100 may be configured to receive the sound source positions (and tracking information) from the position tracker.

The processor and renderer 100 may be configured to process (for example mix) the outputs of the sound source microphones 111, 113, 115 and the spatial audio capture device 105 and output these processed signals to the headphones 121. The processor and renderer 100 as shown herein may be configured to receive an input from an input controller 103 and head-tracker (or tracker) 101 and process the audio signals from the audio sources/spatial audio capture device (or apparatus) based on these inputs as described in further detail hereafter.

The system 99 furthermore may comprise an input controller 103. The input controller 103 may enable the user listening to the audio output of the processor and renderer 100 (for example via the headphones 121) to control the processing of the output. In some embodiments the input controller 103 may thus be configured to provide a suitable selection and control output to the processor and renderer 100 to control the processing (for example mixing) of audio sources and spatial audio capture device audio signals generated by the processor and renderer 100. The input controller 103 may have physical controller elements, for example sliders, dials, buttons or may be virtual touch screen representations of physical controller elements. In some embodiments the physical controller elements are dynamically reconfigurable such that the same controller element may control a first parameter or function during a first time period and a second parameter or function during a second time period.

The system 99 furthermore may comprise a head tracker (which may also be known as a sound source tracker or simply tracker) 101 which may be any suitable inertial sensor which tracks a head orientation of the user listening to the output. In other words the head tracker 101 may be any suitable means for generating a measurement of azimuth and/or elevation. For example the head tracker may be a sensor attached to the headphones 121 configured to monitor the orientation and/or azimuth of the user listening to the output with respect to a defined or reference orientation (such as a 'front' microphone array direction) and provide a value or input which can be output to the processor and renderer 100. The head tracker 101 may in some embodiments be implemented by at least one gyroscope and/or digital compass. For ease of operation, the head tracker and the spatial audio capture device microphone array can include a magnetic compass to remove the need for a dedicated manual calibration step. In the absence of a magnetic compass, the user with the head tracker looks in the same direction as the reference axis of the audio capture system for calibrating the system.

With respect to FIG. 1a the system 99 furthermore comprises a pair of headphones 121 which may be worn on the head of the listener and which comprise a pair of transducers coupled via a suitable band. The band may have mounted on it the head tracker 101. In some embodiments the headphones 121 may be earpiece, earphone or similar suitable for converting an electrical signal into an acoustic output for the user.

Figure 1B:
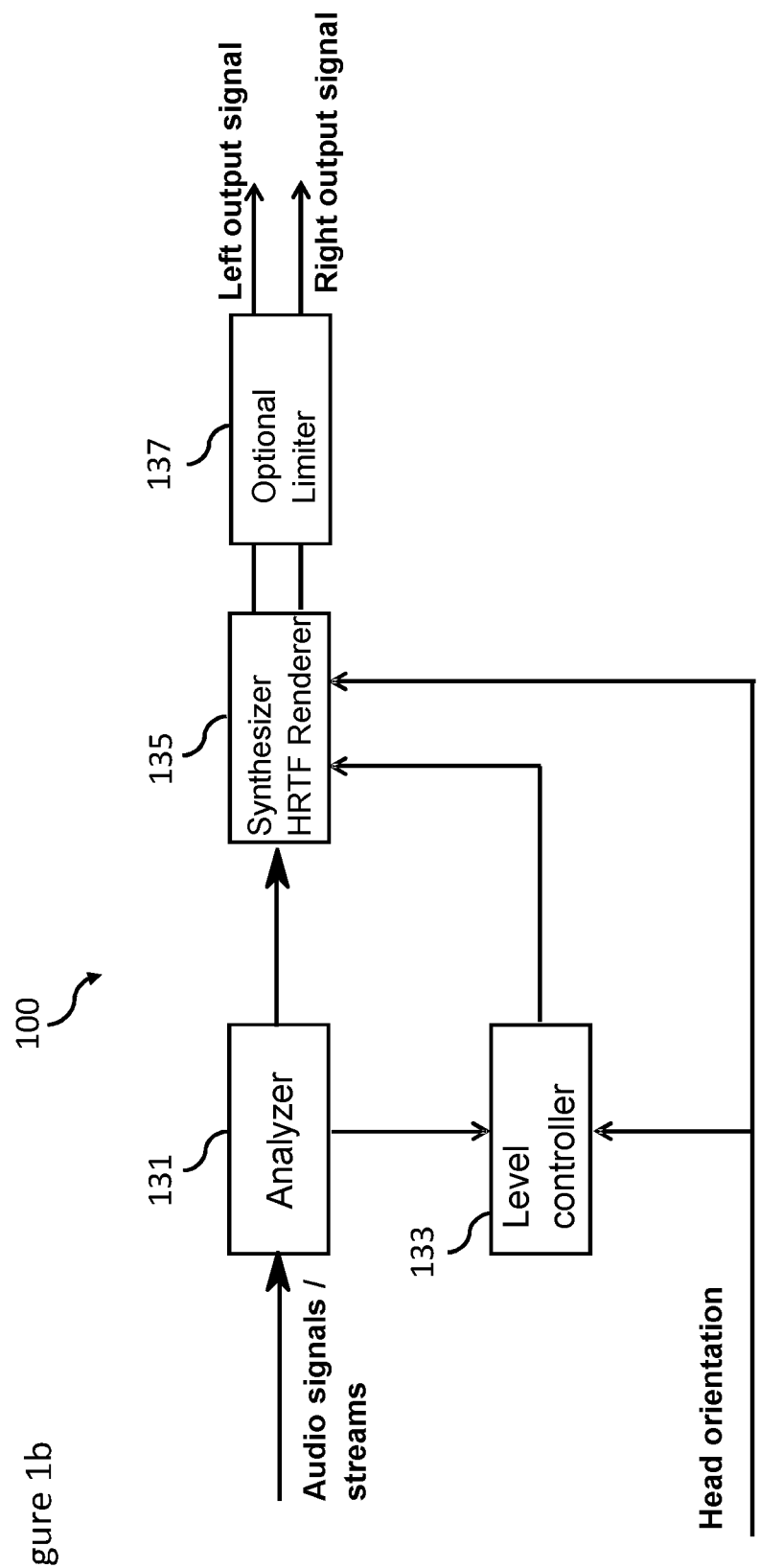

FIG. 1b shows an example processor and renderer 100 in further detail. The processor and renderer 100 is configured to receive audio signals/streams. For example the processor and renderer 100 may be configured to receive audio signals from the microphone array 141 (within the spatial audio capture device 105) or from the first sound source microphone 111 or the second sound source microphone 113 or the third sound source microphone 115. The input may therefore comprise two or more microphone signals of a microphone array or one or more audio object signals originating from the Lavalier or music instrument microphone located at known directions (In certain embodiments, any other audio signal that has an associated position value may be used as the audio signal/stream). The input may in some embodiments be 'recorded' or stored audio signals. For example the input may comprise multichannel loudspeaker signals, in other words audio signals arranged in a loudspeaker channel configuration. In some embodiments the audio input may comprise sampled audio signals and metadata describing audio source or object directions or locations relative to the listener. In some embodiments the audio input signal may comprise other optional parameters such as gain values, or equalisation filters to be applied to the audio signals.

The processor and renderer 100 in some embodiments comprises an analyser 131. The analyser 131 is configured to analyse the audio input to determine orientations or positions associated with the audio sources. The analyser 131 may perform any suitable directional or positional analysis. For example in some embodiments the analyser 131 is configured to receive the outputs of the positioning system 151 from the spatial audio capture device 105 and from this information determine the orientation or positions of the sources.

In some embodiments the analyser 131 may be configured to receive the audio signals from the spatial audio capture device 105 and analyse these to determine directional or positional information associated with the audio sources or objects within the soundscape. Similarly as has been described previously the sound source microphones may comprise microphone arrays and as such the analyser analyse the audio signals from sound source microphone to determine audio sources/objects within the soundscape.

The analyser 131 may be configured to determine the direction of arrival (DOA) of the sound sources. Furthermore the analyser 131 may be configured to determine the ratio of direct and ambient components or other parameters which assist in describing and defining the soundscape.

Figure 2:
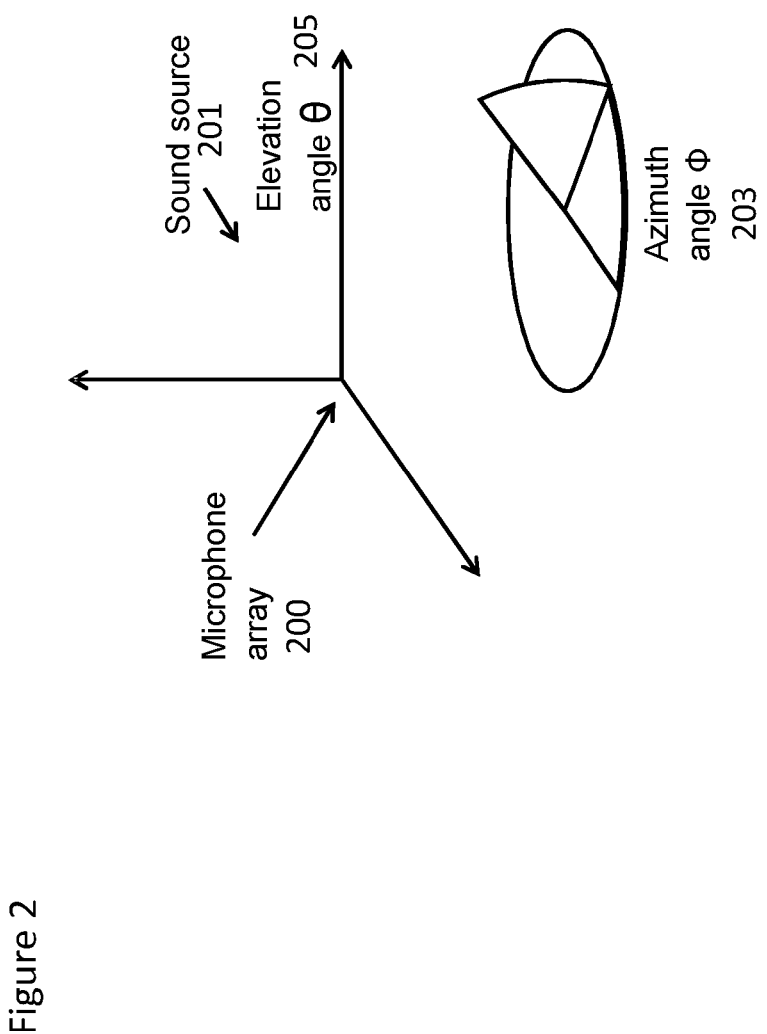
FIG. 2 shows schematically an example orientation of a sound source relative to a microphone array.

FIG. 2 for example shows an example where there is a single sound source 201 and a microphone array 200 (which may for example be the microphone array 141 of the spatial audio capture device 105) and which comprises M microphones. The microphone array 200 can be configured to provide microphone signals $x(m,n')$, where m and n' are indices for microphone and time respectively. The sound source 201 may be shown as having an azimuth angle Φ(k,n) and elevation angle θ(k,n) in a spherical coordinate system and where k, m, and n are indices for frequency, microphone and time, respectively.

The analyser 131 may transform the input signals into the frequency domain by means of a short time Fourier transform $$X(k,m,n)=F(x(m,n')),$$

where X denotes the transformed signals.

There are many known methods for the determination of direction of arrival for the sound sources. In this section, one method is described to determine the directional information. This method has been found to be efficient. This method is merely exemplary and other methods may be used. This method is based on correlation between audio input signal channels. In this method the direction of arriving sound is estimated independently for B frequency domain subbands. The idea is to find the direction of the perceptually dominating sound source for every subband. Having determined the direction of the perceptually dominating sound source for every subband it is possible then to determine where there are multiple sound sources and their associated directions if the multiple sound sources dominate different sub-bands.

As indicated above each input signal m is transformed to the frequency domain using the Fourier transform, which may be a DFT (discrete Fourier transform) or other suitable implemented transform. In an exemplary embodiment, the transform windowing method uses sinusoidal windows with 50 percent overlap and effective length of 20 ms (milliseconds). In some embodiments before the Fourier transform is implemented, $D_{tot}=D_{max}+D_{HRTF}$ zeros are added to the end of the window. $D_{max}$ corresponds to the maximum delay in samples between the microphones. The maximum delay may be obtained as $$D_{max} = \frac{dF_s}{v},$$

where $F_s$ is the sampling rate of signal and v is the speed of the sound in the air. The value $D_{HRTF}$ is the maximum delay caused to the signal by any HRTF (head related transfer function) processing which may be implemented within the Synthesizer and HRTF renderer 135.

After the DFT transform, the frequency domain representation X(k,m,n) for all microphone m, k=0, . . . , N−1. N is the total length of the window considering the sinusoidal window (length Ns) and the additional $D_{tot}$ zeroes.

The frequency domain representation is divided into B subbands $$X_m^b(k)=X_m(k_b+i), i=0, \ldots ,i_{b+1}-i_b-1, b=0, \ldots , B-1, \quad (2)$$

where $k_b$ is the first index of bth subband. The widths of the subbands can follow, for example, the ERB (equivalent rectangular bandwidth) scale.

For every subband, the directional analysis is performed as follows.
1. A subband is selected.
2. Directional analysis is performed on the signals in the subband. Such a directional analysis determines a direction $α_b$ of the (e.g., dominant) sound source.
3. Determine if all subbands have been selected. If not select a new subband and repeat step 2 otherwise then process the determined subband directions to determine the dominant (and other) sound source directions.

The step 2 may be subdivided into the following sub-steps or operations.

First the direction is estimated with two microphone signals (in this example microphones 2 and 3). For the two input microphone audio signals, the time difference between the frequency-domain signals in those channels is removed. The task is to find delay $τ_b$ that maximizes the correlation between two channels for subband b.

The frequency domain representation of, e.g., $X_m^b(k)$ can be shifted $τ_b$ time domain samples using $$X_{m,τ_b}^b(k) = X_m^b(k)e^{-j\frac{2\pi k τ_b}{N}}.$$

The optimal delay is then obtained from $$\max_{τ_b} \text{Re}\left(\sum_{k=0}^{n_{b+1}-n_b-1} \left(X_{2,τ_b}^b(k)^* X_3^b(k)\right)\right), τ_b \in [-D_{max}, D_{max}]$$

where Re indicates the real part of the result and * denotes complex conjugate. $X_{2,τ_b}^b$ and $X_3^b$ are considered vectors with length of $k_{b+1}-k_b$ samples. Resolution of one sample is generally suitable for the search of the delay. Also other perceptually motivated similarity measures than correlation can be used. With the delay information, a sum signal is created using the following logic $$X_{sum}^b = \begin{cases} (X_{2,τ_b}^b + X_3^b)/2 & τ_b \leq 0 \\ (X_2^b + X_{3,-τ_b}^b) & τ_b > 0 \end{cases}$$

where $τ_b$ is the optimal delay defined earlier.

With the sum signal the content (i.e., frequency-domain signal) of the microphone in which an event occurs first is added as such, whereas the content (i.e., frequency-domain signal) of the microphone in which the event occurs later is shifted to obtain the best match.

A sound source thus may be considered to create an event described by an exemplary time-domain function which is received at a microphone for example a second microphone in the array and the same event received by a third microphone. In an ideal scenario, the exemplary time-domain function which is received at the second microphone in the array is simply a time shifted version of the function received at the third microphone. This situation is described as ideal because in reality the two microphones will likely experience different environments for example where their recording of the event could be influenced by constructive or destructive interference or elements that block or enhance sound from the event, etc.

The shift $τ_b$ indicates how much closer the sound source is to the second microphone than the third microphone (when $τ_b$ is positive, the sound source is closer to the second microphone than the third microphone). The actual difference in distance can be calculated as $$\Delta_{23} = \frac{vτ_b}{F_s}.$$

Utilizing basic geometry it can be determined that the angle of the arriving sound is equal to $$\dot\alpha_b = \pm\cos^{-1}\left(\frac{\Delta_{23}^2 + 2b\Delta_{23} - d^2}{2db}\right),$$

where d is the distance between microphones and b is the estimated distance between sound sources and nearest microphone. Typically b can be set to a fixed value. For example b=2 meters has been found to provide stable results.

Notice that there are two alternatives for the direction of the arriving sound as the exact direction cannot be determined with only two microphones.

A further microphone, for example a first microphone in an array of three microphones, can then be utilized to define which of the signs (the + or −) is correct. The distances between the first microphone and the two estimated sound sources can be defined as:

$$\delta_b^+ = \sqrt{(h+b\sin(\dot\alpha_b))^2 + (d/2+b\cos(\dot\alpha_b))^2}$$

$$\delta_b^- = \sqrt{(h-b\sin(\dot\alpha_b))^2 + (d/2+b\cos(\dot\alpha_b))^2},$$

where h is the height of a equilateral triangle defined by the example arrangement of the first, second and third microphones where the microphones are located at the vertices of the triangle. In this example h may be defined as:

$$h = \frac{\sqrt{3}}{2}d.$$

The distances in are equal to the delay in samples:

$$\tau_b^+ = \frac{\delta^+ - b}{v}F_s$$

$$\tau_b^- = \frac{\delta^- - b}{v}F_s.$$

Out of these two delays, the one is selected that provides better correlation with the sum signal. The correlations are obtained as $$c_b^+ = \text{Re}(\Sigma_{k=0}^{kb+1-kb-1}(X_{sum,\tau_b^+}^b(k)^*X_1^b(k)))$$

$$c_b^- = \text{Re}(\Sigma_{k=0}^{kb+1-kb-1}(X_{sum,\tau_b^-}^b(k)^*X_1^b(k))).$$

Now the direction may be obtained for the dominant sound source for subband b by:

$$\alpha_b = \begin{cases} \dot\alpha_b & c_b^+ \geq c_b^- \\ -\dot\alpha_b & c_b^+ < c_b^- \end{cases}.$$

The same estimation is repeated for each subband.

This method can be applied to microphone arrays where there is both 'horizontal' and 'vertical' displacement in order that the azimuth and elevation can be determined.

The directions of sound sources can thus be expressed in terms of azimuth Φ(b,n) and elevation θ(b,n) angles in a spherical coordinate system where b is the subband (in other words groups of k indices). The analyser 131 thus can process the inputs and provides directional information and other metadata or parameters describing the sound field.

This positional metadata may then be forwarded to the synthesizer/renderer 135 and level controller 133.

Furthermore as shown in FIG. 1b the processor and renderer 100 may comprise a synthesizer/renderer 135. The synthesizer/renderer 135 may be configured to synthesize the binaural output audio signals using the directional metadata and the input signals X(k,n,m) from the analyzer 131, a gain or level control from the level controller 133, and the head tracker orientation.

The synthesizer/renderer 135 may be configured to generate or synthesize the left and right channel output audio signals by applying head-related transfer functions (HRTF) to the input audio signal. The HRTFs denote how the human ear, head, torso, etc., affect the sound originating from a certain direction. Hence, as simplified, different HRTFs are applied based on the DOA of the audio sources and the head tracker orientations.

Figure 3:
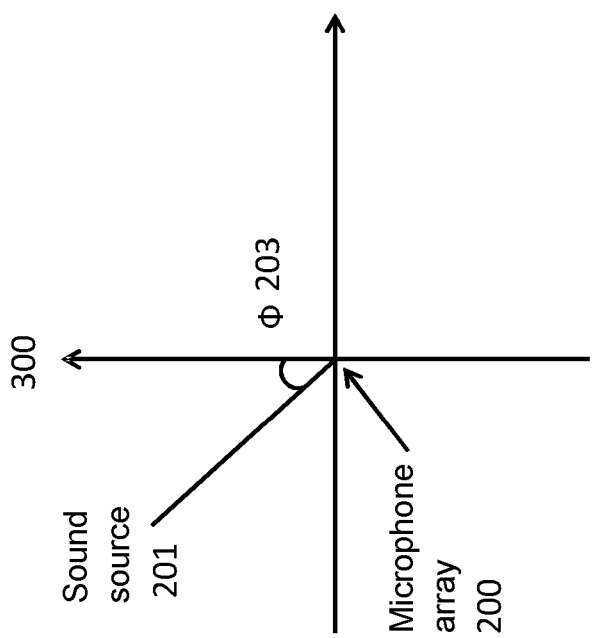
FIG. 3 shows schematically an example orientation of a sound source relative to a head-tracker first or reference orientation.

With respect to FIG. 3 an example orientation of a sound source relative to a head tracker first (or reference) orientation is shown. In this example the sound source 201 is shown located with a fixed elevation angle (θ=0) and an azimuth angle ϕ 203 relative to the microphone array 200 reference orientation 300. Thus when the head tracker is orientated in the same 'reference' orientation or direction as the microphone array the example sound source 201 is located on the left side of the listener. In such an example the synthesizer 135 would be configured to apply a first 'left channel' HRTF to the input audio signal to produce a left channel binaural output audio signal and furthermore a second 'right channel' HRTF to the input audio signal to output a right channel binaural output audio signal.

It is understood that in the example shown above the head of the listener would shadow the direct path from the audio source to the right ear and the amplitude response of the corresponding HRTF would have a low pass filter shape. On the contrary the head would not shadow the path from the audio source to the left ear audio output and the amplitude response of the corresponding HRTF does not have this low pass characteristic and high frequencies would be more dominant. The synthesiser/renderer 135 is furthermore configured in such a way that when a listener uses the head tracker the rendered soundscape moves based on their head movement.

Figure 4:
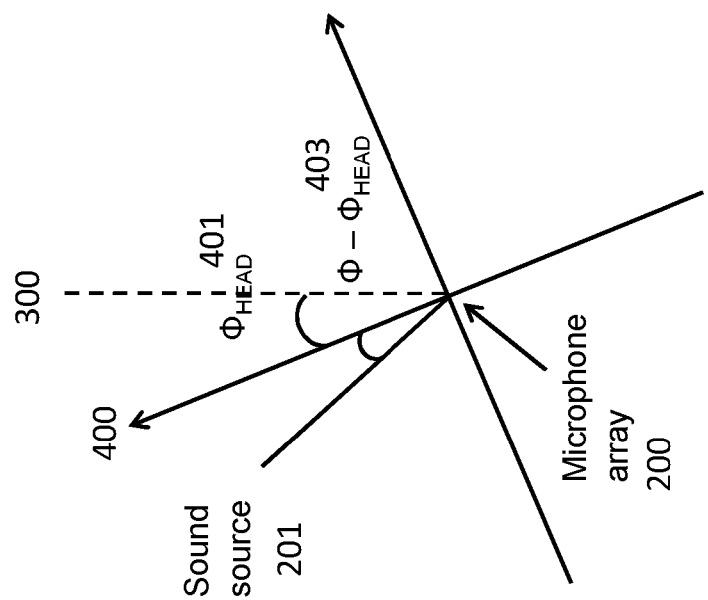
FIG. 4 shows schematically an example orientation of a sound source relative to a head-tracker second or rotated orientation.

For example FIG. 4 shows an example where the head tracker is located at a second or the rotated orientation relative to the first or reference orientation. Thus for example the head tracker orientation 400 is at an orientation angle ϕ$_{head}$ 401 relative to the microphone array reference orientation 300. The orientation of the sound source 201 relative to the listener (which is now defined by the orientation 400) can be defined as ϕ−ϕ$_{head}$ 403. In this example the synthesizer 135 would now render the audio signal using HRTF's based on a sound source input orientation of the new azimuth angle ϕ−ϕ$_{head}$ head and not the original azimuth angle ϕ. The effect of the application of variable HRTF's based on the variable head tracker orientation is such that not only do the left and right channel output audio signal change with respect to the frequency response but that will also change the output level.

Figure 5:
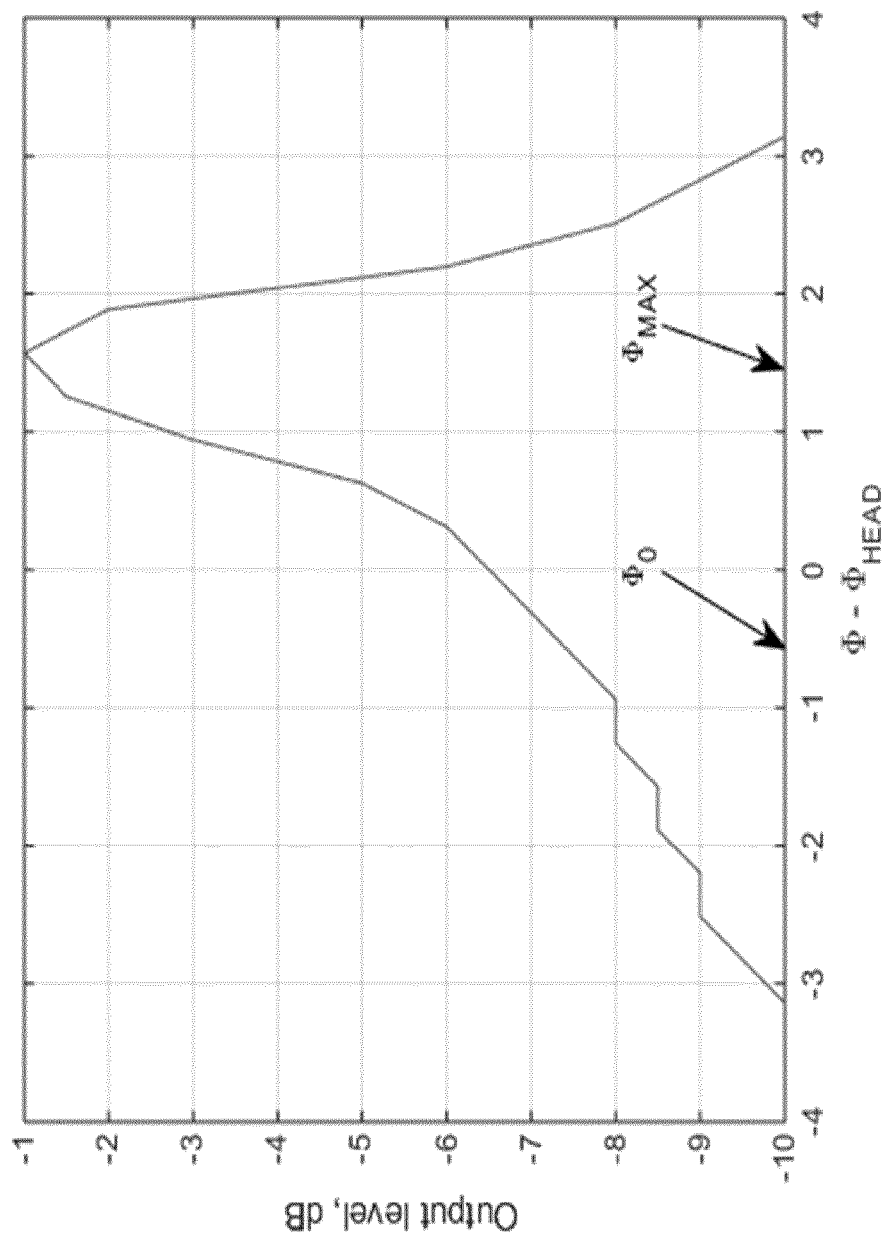
FIG. 5 shows schematically an example output level distribution for an example audio signal and relative to head-tracker orientation difference between the first and second orientations.

The change in the output levels as the azimuth angle changes is shown in FIG. 5. FIG. 5 shows an example output level distribution for the left channel audio output for changes in sound source and head tracker orientation ϕ−ϕ$_{head}$. The angle ϕ$_0$=ϕ−ϕ$_{head}$ is an arbitrary fixed angle. The maximum output level may be heard at ϕ$_{Max}$ 502 and an output level a few decibels lower at ϕ$_0$ 503. The optimal curves shown in the FIG. 8 can be selected in such a way that the maximum desired output level is not exceeded.

Figure 6:
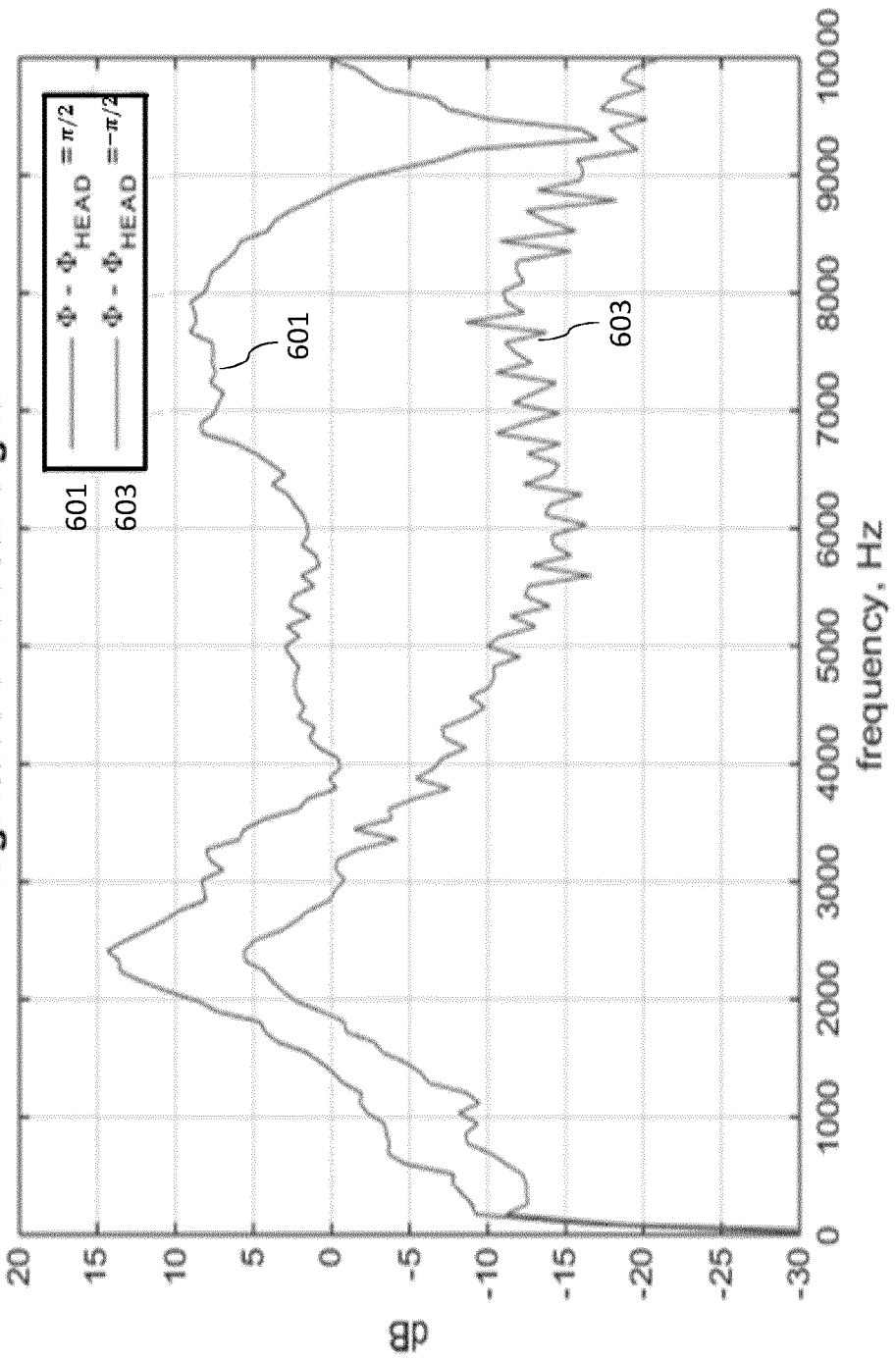
FIG. 6 shows schematically example output level frequency distributions for the example audio signal based on the head-tracker orientation difference between the first and second orientations.

As described herein the change in the output levels is stronger for the higher frequency ranges. For example FIG. 6 shows schematically the example output level frequency distributions for the example audio signal based on the head tracker orientation difference $\phi-\phi_{head}=\pi/2$ 601 and also for $\phi-\phi_{head}=-\pi/2$ 603. As can be seen in this example the output level where the left ear is 'towards' the direction of arrival for the example source $\phi-\phi_{head}=\pi/2$ 601 then the frequency response for the output audio signal is high for a large portion of the spectrum. Where the left ear is 'away' from the direction of arrival for the example source $\phi-\phi_{head}=-\pi/2$ 603, then the head shadowing effect causes a reduction in the output level for the spectrum and the reduction is significant for the higher frequencies (for example >3500 Hz).

These output level changes should be considered in gain control and dynamic range control operations.

Figure 7:
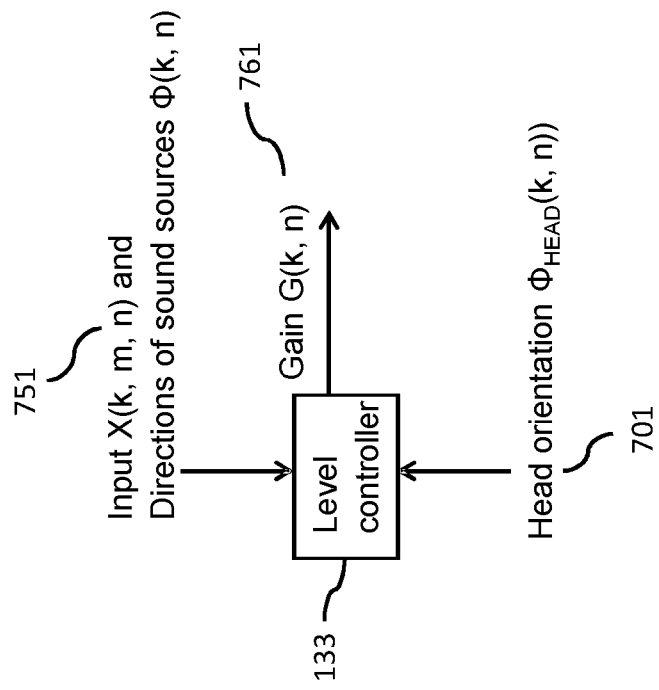
FIG. 7 shows schematically the level controller shown in FIG. 1b in further detail.

FIG. 7 shows in further detail the level controller 133 shown in FIG. 1b. The level controller as shown in FIG. 1b is configured to receive from the analyser 13 the input audio signals X(k,n,m) and other metadata associated with the input audio signals (such as the directions of the sound sources $\Phi(k,n)$). Furthermore the level controller 133 can be configured to receive the head orientation value 701 from the head tracker $\Phi_{HEAD}(k,n)$.

The level controller 133 is configured to generate based on the input audio signal, the direction of sound sources, and the head tracker orientation value a gain value G(k,n) and output the gain value G(k,n) 761 to the synthesizer/renderer 135.

The synthesizer/renderer 135 may be configured to receive these gain values and apply these gain values to either the input audio signal X(k,n,m) or to each of the output audio signals.

In some embodiments the level controller 133 is configured to calculate an input level estimate X'(k,n)=max(abs (X(k,m,n))) over the M microphone inputs m=[1, M] and an output gain that provides the desired relationship between the input level and output level as a function of the azimuth angle defined by $\phi-_{head}$. In some embodiments the gain relationship may be represented as a series of functions (or curves) which are selected in such a way that the maximum desired output level is not exceeded at the angle $\phi(k)-\phi_{head}$ (k). The functions or curves in some embodiments may be generated based on the output level estimate such as shown in FIG. 5. The input level and output level relationship is measured for different azimuth angles $\phi-\phi_{head}$ and frequency ranges k and a gain providing the desired relationship is determined. In one example embodiment, the level control algorithm may use a table lookup function to select a curve that provides the desired input level and output level relationship.

A gain curve may consist of two or more sections to provide e.g. a constant gain on low input levels and lower gain on higher input levels to avoid overflow. To minimize the headroom, the gain $g_{MIN}(k,\phi)$ used at the maximum expected input level must be determined. If the system threshold $Y_{THMAX}(k)$ defines the maximum level for the left and right outputs and symbol $Y_{MAX}(k, \phi)$ denotes the output level at the maximum expected input level, the gain is $g_{MIN}(k,\phi)=Y_{THMAX}(k)/Y_{MAX}(k,\phi)$. The other gain curve parameters, e.g. the constant gain value, depend on a system in hand and are often determined subjectively. By assuming linearity, we find an estimate for the output level $Y_{EST}(k, \phi, n)=C*X'(k,n)*Th(k,\phi(n))$. The term $Th(k, \phi(n))$ adds the azimuth angle dependency to the output level estimate and C is a scalar constant. The measurement data can be used to determine the C and Th values.

Figure 8:
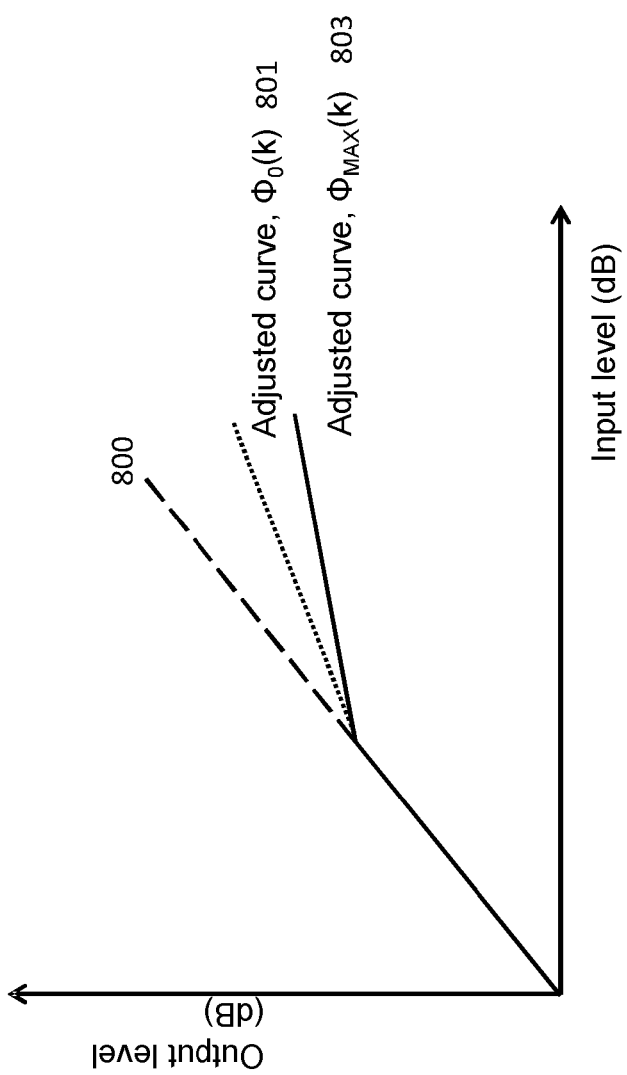
FIG. 8 shows schematically the effect of the level controller shown in FIG. 7.

For example FIG. 8 shows an example series of functions which show the gain function curves for a single frequency range and for a pair of azimuth angles. Thus for example the gain functions 800 up to a defined input level are the same and are independent on the azimuth angle. Above the defined input level the gain functions vary according to the azimuth angle such that the max output level gain function 803 is lower than the reference output level gain function 801. In such a manner by using position and frequency dependent curves the level controller can minimise the needed headroom.

In some embodiments having near field microphones with known directions, the level controller 133 may be configured to calculate an output level estimate $Y_{EST}(k,n)$=sqrt (sum(abs(X(k,m,n))$^2$*Th(k,$\phi$(m,n)-$\phi_{head}$(n))$^2$)) over the M microphone inputs m=[1, M].

The term Th(k,$\phi$(m,n)-$\phi_{head}$(n)) compensates the azimuth angle dependency of the input level and the output level relation for each near field microphone m.

Therefore, the level control algorithm may use a fixed curve that defines the desired output level as a function of the estimated output level $Y_{EST}$ for each frequency range k.

As discussed previously the synthesiser/renderer 135 can be configured to receive the gain input G(k,n) and use a multiplier to apply the gain to the signal path. In some embodiments the gain is applied by a multiplier block between the analyser 131 and synthesiser/renderer 135.

In such embodiments as described above the system may achieve a lower minimum delay and computational burden on the system because separate buffering, frequency domain transforms, or filter banks are not needed for the application of level control functions.

Furthermore in some embodiments the processor and renderer 100 may comprises a limiter 137. The limiter 137 receives the output of the synthesizer/renderer 135 and ensures that the pulse code modulated (PCM) signal fits in the desired amplitude range and therefore enables use of a slightly smaller headroom. In order to avoid increasing the system delay the limiter 137 can utilise the output buffering of the synthesizer/renderer 135.

In some embodiments it is possible to modify the level controller described herein such that it is able to implement a separate cascaded level controller processing for specific inputs. For example for percussion instrument or bass guitar. In some embodiments, near mic inputs, such as drums, may have a separate level control function before they are mixed to the output signal.

In some embodiments the user's head orientation/position received from the position tracker can be treated as continuous functions which can be modelled with a mass and inertia. Thus it may be possible to predict future head position/orientation from the current head position/orientation from the translation and/or rotation speeds. In some embodiments the level controller may be configured to determine gain estimates not only for the current head position but also for a predicted head position. For example where the listener is turning their ear towards a sound source the level control may be able to produce a smoother control curve.

As described earlier whereas the prior-art gain-control methods cause extra delay, which is highly unwanted in head-tracked binaural rendering, the embodiments detailed above avoid this by integrating the gain control inside the spatial-sound processing.

Furthermore prior-art gain-control methods cause extra computational complexity, because they require independent processing blocks. The proposed embodiments may avoid this by integrating the level (gain) control into the spatial-sound rendering. Hence, the level (gain) control can be performed with minimal extra processing.

Also prior-art gain-control methods do not take head-tracking information nor the DOA information into account. Hence, they either need extra headroom or extra delay to avoid clipping. The proposed invention uses this information so neither extra headroom nor extra delay is needed.

Where the additional limiter is used after the synthesizer/renderer, the embodiments described herein are expected to produce better output audio quality than prior art solutions, since the soft-limiting functionality is typically needed less often.

Figure 9:
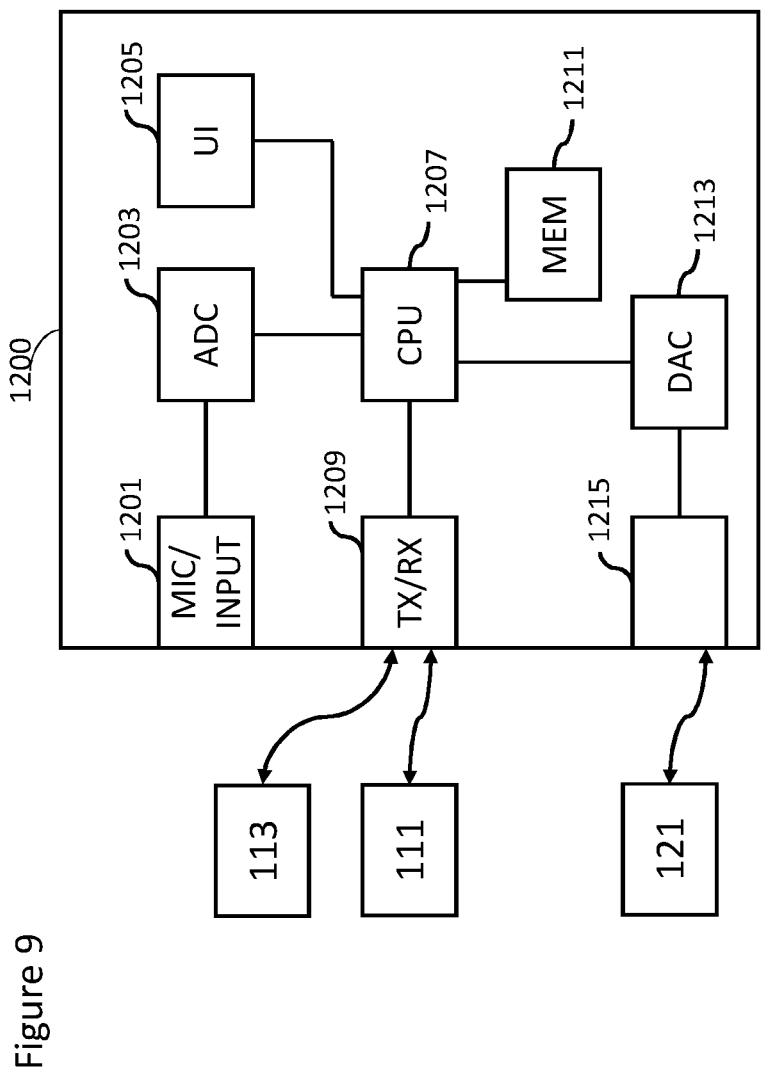
FIG. 9 shows an example electronic device suitable for implementing embodiments.

With respect to FIG. 9 an example electronic device which may be used as at least part of the processor and renderer 100 or as part of the system 99 is shown. The device may be any suitable electronics device or apparatus. For example in some embodiments the device 1200 is a virtual or augmented reality capture device, a mobile device, user equipment, tablet computer, computer, audio playback apparatus, etc.

The device 1200 may comprise a microphone array 1201. The microphone array 1201 may comprise a plurality (for example a number M) of microphones. However it is understood that there may be any suitable configuration of microphones and any suitable number of microphones. In some embodiments the microphone array 1201 is separate from the apparatus and the audio signals transmitted to the apparatus by a wired or wireless coupling. The microphone array 1201 may in some embodiments be the SPAC microphone array 144 as shown in FIG. 1a.

The microphones may be transducers configured to convert acoustic waves into suitable electrical audio signals. In some embodiments the microphones can be solid state microphones. In other words the microphones may be capable of capturing audio signals and outputting a suitable digital format signal. In some other embodiments the microphones or microphone array 1201 can comprise any suitable microphone or audio capture means, for example a condenser microphone, capacitor microphone, electrostatic microphone, Electret condenser microphone, dynamic microphone, ribbon microphone, carbon microphone, piezoelectric microphone, or microelectrical-mechanical system (MEMS) microphone. The microphones can in some embodiments output the audio captured signal to an analogue-to-digital converter (ADC) 1203.

The device 1200 may further comprise an analogue-to-digital converter 1203. The analogue-to-digital converter 1203 may be configured to receive the audio signals from each of the microphones in the microphone array 1201 and convert them into a format suitable for processing. In some embodiments where the microphones are integrated microphones the analogue-to-digital converter is not required. The analogue-to-digital converter 1203 can be any suitable analogue-to-digital conversion or processing means. The analogue-to-digital converter 1203 may be configured to output the digital representations of the audio signals to a processor 1207 or to a memory 1211.

In some embodiments the device 1200 comprises at least one processor or central processing unit 1207. The processor 1207 can be configured to execute various program codes. The implemented program codes can comprise, for example, SPAC control, level control, analysis, and synthesizing/rendering such as described herein.

In some embodiments the device 1200 comprises a memory 1211. In some embodiments the at least one processor 1207 is coupled to the memory 1211. The memory 1211 can be any suitable storage means. In some embodiments the memory 1211 comprises a program code section for storing program codes implementable upon the processor 1207. Furthermore in some embodiments the memory 1211 can further comprise a stored data section for storing data, for example data that has been processed or to be processed in accordance with the embodiments as described herein. The implemented program code stored within the program code section and the data stored within the stored data section can be retrieved by the processor 1207 whenever needed via the memory-processor coupling.

In some embodiments the device 1200 comprises a user interface 1205. The user interface 1205 can be coupled in some embodiments to the processor 1207. In some embodiments the processor 1207 can control the operation of the user interface 1205 and receive inputs from the user interface 1205. In some embodiments the user interface 1205 can enable a user to input commands to the device 1200, for example via a keypad. In some embodiments the user interface 205 can enable the user to obtain information from the device 1200. For example the user interface 1205 may comprise a display configured to display information from the device 1200 to the user. The user interface 1205 can in some embodiments comprise a touch screen or touch interface capable of both enabling information to be entered to the device 1200 and further displaying information to the user of the device 1200.

In some implements the device 1200 comprises a transceiver 1209. The transceiver 1209 in such embodiments can be coupled to the processor 1207 and configured to enable a communication with other apparatus or electronic devices, for example via a wireless communications network. The transceiver 1209 or any suitable transceiver or transmitter and/or receiver means can in some embodiments be configured to communicate with other electronic devices or apparatus via a wire or wired coupling.

For example as shown in FIG. 9 the transceiver 1209 may be configured to communicate with head tracker 101, SPAC device 105, or headphones 121.

The transceiver 1209 can communicate with further apparatus by any suitable known communications protocol. For example in some embodiments the transceiver 209 or transceiver means can use a suitable universal mobile telecommunications system (UMTS) protocol, a wireless local area network (WLAN) protocol such as for example IEEE 802.X, a suitable short-range radio frequency communication protocol such as Bluetooth, or infrared data communication pathway (IRDA).

In some embodiments the device 1200 may be employed as a mixer and/or render apparatus. As such the transceiver 1209 may be configured to receive the audio signals and positional information, and generate a suitable audio signal rendering by using the processor 1207 executing suitable code. The device 1200 may comprise a digital-to-analogue converter 1213. The digital-to-analogue converter 1213 may be coupled to the processor 1207 and/or memory 1211 and be configured to convert digital representations of audio signals (such as from the processor 1207 following an audio rendering of the audio signals as described herein) to a suitable analogue format suitable for presentation via an audio subsystem output. The digital-to-analogue converter (DAC) 1213 or signal processing means can in some embodiments be any suitable DAC technology.

Furthermore the device 1200 can comprise in some embodiments an audio subsystem output 1215. An example, such as shown in FIG. 9, may be where the audio subsystem output 1215 is an output socket configured to enabling a coupling with the headphones 121. However the audio subsystem output 1215 may be any suitable audio output or a connection to an audio output. For example the audio subsystem output 1215 may be a connection to a multichannel speaker system.

In some embodiments the digital to analogue converter 1213 and audio subsystem 1215 may be implemented within a physically separate output device. For example the DAC 1213 and audio subsystem 1215 may be implemented as cordless earphones communicating with the device 1200 via the transceiver 1209.

Although the device 1200 is shown having both audio capture and audio rendering components, it would be understood that in some embodiments the device 1200 can comprise just the audio capture or audio render apparatus elements.

In general, the various embodiments of the invention may be implemented in hardware or special purpose circuits, software, logic or any combination thereof. For example, some aspects may be implemented in hardware, while other aspects may be implemented in firmware or software which may be executed by a controller, microprocessor or other computing device, although the invention is not limited thereto. While various aspects of the invention may be illustrated and described as block diagrams, flow charts, or using some other pictorial representation, it is well understood that these blocks, apparatus, systems, techniques or methods described herein may be implemented in, as non-limiting examples, hardware, software, firmware, special purpose circuits or logic, general purpose hardware or controller or other computing devices, or some combination thereof.

The embodiments of this invention may be implemented by computer software executable by a data processor of the mobile device, such as in the processor entity, or by hardware, or by a combination of software and hardware. Further in this regard it should be noted that any blocks of the logic flow as in the Figures may represent program steps, or interconnected logic circuits, blocks and functions, or a combination of program steps and logic circuits, blocks and functions. The software may be stored on such physical media as memory chips, or memory blocks implemented within the processor, magnetic media such as hard disk or floppy disks, and optical media such as for example DVD and the data variants thereof, CD.

The memory may be of any type suitable to the local technical environment and may be implemented using any suitable data storage technology, such as semiconductor-based memory devices, magnetic memory devices and systems, optical memory devices and systems, fixed memory and removable memory. The data processors may be of any type suitable to the local technical environment, and may include one or more of general purpose computers, special purpose computers, microprocessors, digital signal processors (DSPs), application specific integrated circuits (ASIC), gate level circuits and processors based on multi-core processor architecture, as non-limiting examples.

Embodiments of the inventions may be practiced in various components such as integrated circuit modules. The design of integrated circuits is by and large a highly automated process. Complex and powerful software tools are available for converting a logic level design into a semiconductor circuit design ready to be etched and formed on a semiconductor substrate.

Programs, such as those provided by Synopsys, Inc. of Mountain View, Calif. and Cadence Design, of San Jose, Calif. automatically route conductors and locate components on a semiconductor chip using well established rules of design as well as libraries of pre-stored design modules. Once the design for a semiconductor circuit has been completed, the resultant design, in a standardized electronic format (e.g., Opus, GDSII, or the like) may be transmitted to a semiconductor fabrication facility or "fab" for fabrication.

The foregoing description has provided by way of exemplary and non-limiting examples a full and informative description of the exemplary embodiment of this invention. However, various modifications and adaptations may become apparent to those skilled in the relevant arts in view of the foregoing description, when read in conjunction with the accompanying drawings and the appended claims. However, all such and similar modifications of the teachings of this invention will still fall within the scope of this invention as defined in the appended claims.

The invention claimed is:

1. Apparatus comprising:
    at least one processor; and
    at least one non-transitory memory including computer program code, wherein the at least one memory and the computer program code are configured to, with the at least one processor, cause the apparatus at least to:
        provide a position and/or orientation for at least one sound source relative to a reference position;
        analyse at least one input audio signal associated with the at least one sound source to estimate at least one maximum input level for the at least one input audio signal;
        determine a position and/or orientation of a user;
        determine a difference between the position and/or orientation for the at least one sound source and the position and/or orientation of the user;
        determine at least one gain value based on the at least one estimated maximum input level and the determined difference, wherein the at least one gain value comprises at least a first frequency band related level control gain for at least a first frequency band associated with the at least one input audio signal; and
        synthesize at least two output channels based, at least partially, on the at least one input audio signal, a directional transfer function pair, the at least one gain value and the position and/or orientation for the at least one sound source.

2. The apparatus as claimed in claim 1, wherein the providing of the position and/or orientation for the at least one sound source comprises the at least one memory and the computer program code are configured to, with the at least one processor, cause the apparatus to at least one of:
    analyse at least two microphone audio signals to determine the position and/or orientation for the at least one sound source; or
    retrieve the position and/or orientation for the at least one sound source from metadata associated with the at least one input audio signal wherein the metadata comprises a directional parameter for a frequency band.

3. The apparatus as claimed in claim 1, wherein the at least one memory and the computer program code are configured to, with the at least one processor, cause the apparatus to determine a position and/or orientation of a tracker relative to the reference position, wherein determining the position and/or orientation of the user comprises determining the position and/or orientation of the tracker.

4. The apparatus as claimed in claim 3, wherein when the apparatus is configured to determine the position and/or orientation of the tracker, the at least one memory and the computer program code are configured to, with the at least one processor, cause the apparatus to receive at least one of:
   a direction from a digital compass;
   a direction from a gyroscope;
   a direction from a beacon positioning system; or
   a modelled direction with inertia and mass such that the modelled position is an estimate of a future actual tracker position.

5. The apparatus as claimed in claim 3, wherein the tracker comprises a headband configured to generate a direction associated with the tracker, wherein the direction being associated with a listening direction of the user.

6. The apparatus as claimed in claim 1, wherein the at least one memory and the computer program code are configured to, with the at least one processor, cause the apparatus to determine the at least one gain value further based on respective maximum output levels for the at least two output channels.

7. The apparatus as claimed in claim 6, wherein the at least one memory and the computer program code are configured to, with the at least one processor, cause the apparatus to synthesize the at least two output channels based on the at least one input audio signal, the directional transfer function pair, the first frequency band related level control gain and the difference between the position and/or orientation for the at least one sound source and the position and/or orientation of the user.

8. The apparatus as claimed in claim 7, wherein the synthesizing of the at least two output channels further comprises the at least one memory and the computer program code are configured to, with the at least one processor, cause the apparatus to:
   generate a left output channel audio signal based on multiplying a left level control gain value with a combination of a first head related transfer function using the difference between the position and/or orientation of the at least one sound source and the position and/or orientation of the user and a modelled left ear position; and
   generate a right output channel audio signal based on multiplying a right level control gain value with a combination of a second head related transfer function using the difference between the position and/or orientation of the at least one sound source and the position and/or orientation of the user and a modelled right ear position.

9. The apparatus as claimed in claim 6, wherein the at least one gain value is configured to control respective levels of the at least two output channels to not exceed the respective maximum output levels when the at least one input audio signal comprises a level reaching one or more of the at least one estimated maximum input level.

10. The apparatus as claimed in claim 1, wherein the at least one memory and the computer program code are configured to, with the at least one processor, cause the apparatus to determine at least one of:
   a second frequency band related level control gain for at least a second frequency band associated with the input audio signal based on the difference between the position and/or orientation for the at least one sound source and the position and/or orientation of the user;
   a first output channel related level control gain for a first output channel based on the difference between the position and/or orientation for the at least one sound source and the position and/or orientation of the user; or
   a second output channel related level control gain for a second output channel based on the difference between the position and/or orientation for the at least one sound source and the position and/or orientation of the user.

11. The apparatus as claimed in claim 1, wherein the position and/or orientation of the user comprises a position and/or orientation of at least part of the apparatus, and wherein the at least one memory and the computer program code are configured to, with the at least one processor, cause the apparatus to limit an output signal value of at least one of the at least two output channels such that the output signal value falls within a defined pulse code modulation scheme dynamic range.

12. The apparatus as claimed in claim 1, wherein the reference position is at least one of:
   an origin position and/or orientation for at least one spatially captured sound source;
   a position and/or orientation of a microphone array configured to capture the at least one input audio signal;
   an origin position and/or orientation for a camera; or
   an origin position and/or orientation for a sound scene within which the at least one sound source is located.

13. A method comprising:
   providing a position and/or orientation for at least one sound source relative to a reference position;
   analysing at least one input audio signal associated with the at least one sound source to estimate at least one maximum input level for the at least one input audio signal;
   determining a position and/or orientation of a user;
   determining a difference between the position and/or the orientation for the at least one sound source and the position and/or orientation of the user;
   determining at least one gain value based on the at least one estimated maximum input level and the determined difference, wherein the at least one gain value comprises at least a first frequency band related level control gain for at least a first frequency band associated with the at least one input audio signal; and
   synthesizing at least two output channels based, at least partially, on the at least one input audio signal, a directional transfer function pair, the at least one gain value and the position and/or orientation for the at least one sound source.

14. The method as claimed in claim 13, wherein the providing of the position and/or orientation for the at least one sound source comprises at least one of:
   analysing at least two microphone audio signals to determine the position and/or orientation for the at least one sound source; or
   retrieving the position and/or orientation for the at least one sound source from metadata associated with the at least one input audio signal, wherein the metadata comprises a directional parameter for a frequency band.

15. The method as claimed in claim 13, further comprising determining a position and/or orientation of a tracker relative to the reference position, wherein the determining of the position and/or orientation of the user comprises determining the position and/or orientation of the tracker.

16. The method as claimed in claim 13, further comprising determining the at least one gain value further based on respective maximum output levels for the at least two output channels.

17. The method as claimed in claim 16, wherein the synthesizing of the at least two output channels is based on the at least one input audio signal, the directional transfer function pair, the first frequency band related level control gain and the difference between the position and/or orientation for the at least one sound source and the position and/or orientation of the user.

18. The method as claimed in claim 17, wherein the synthesizing of the at least two output channels further comprises:

generating a left output channel audio signal based on multiplying a left level control gain value with a combination of a first head related transfer function using the difference between the position and/or orientation of the at least one sound source and the position and/or orientation of the user and a modelled left ear position; and generating a right output channel audio signal based on multiplying a right level control gain value with a combination of a second head related transfer function using the difference between the position and/or orientation of the at least one sound source and the position and/or orientation of the user and a modelled right ear position.

19. The method as claimed in claim 16, further comprising at least one of:

determining a second frequency band related level control gain for at least a second frequency band associated with the input audio signal based on the difference between the position and/or orientation for the at least one sound source and the position and/or orientation of the user;

determining a first output channel related level control gain for a first output channel based on the difference between the position and/or orientation for the at least one sound source and the position and/or orientation of the user; or determining a second output channel related level control gain for a second output channel based on the difference between the position and/or orientation for the at least one sound source and the position and/or orientation of the user.

20. The method as claimed in claim 16, wherein the at least one gain value is configured to control respective levels of the at least two output channels to not exceed the respective maximum output levels when the at least one input audio signal comprises a level reaching one or more of the at least one estimated maximum input level.

\* \* \* \* \*